United States Patent
Hojo (10) Patent No.: US 7,106,642 B2
(45) Date of Patent: Sep. 12, 2006

(54) SEMICONDUCTOR INTEGRATED CIRCUIT DEVICE IN WHICH A MEASURE TO COUNTER SOFT ERRORS IS TAKEN

(75) Inventor: Takehiko Hojo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/076,633

(22) Filed: Mar. 9, 2005

(65) Prior Publication Data

US 2006/0077732 A1   Apr. 13, 2006

(30) Foreign Application Priority Data

Sep. 30, 2004   (JP) ............................. 2004-287698

(51) Int. Cl.
  *G11C 7/00*   (2006.01)
(52) U.S. Cl. ............ 365/200; 365/189.07; 365/189.05; 365/149
(58) Field of Classification Search ................ 365/200, 365/189.07, 230.04, 189.05, 149, 185.09
See application file for complete search history.

(56) References Cited

U.S. PATENT DOCUMENTS 5,640,350 A * 6/1997 Iga ............................. 365/186
6,898,130 B1 * 5/2005 Kajigaya et al. ......... 365/189.02
2004/0190085 A1 * 9/2004 Silverbrook et al. ........ 358/474

FOREIGN PATENT DOCUMENTS

JP   8-161884    6/1996
JP   2003-59290  2/2003

* cited by examiner

*Primary Examiner*—Tuan T. Nguyen
(74) *Attorney, Agent, or Firm*—DLA Piper Rudnick Gray Cary US LLP (57) ABSTRACT

A semiconductor integrated circuit device includes a first memory circuit which stores normal data, a second memory circuit which stores determination information used to determine whether a value of the normal data is changed or not, and a determination circuit which determines whether a value of the normal data is changed or not based on the determination information. The capacitance of a data storage node of the second memory circuit is larger than that of a data storage node of the first memory circuit.

13 Claims, 11 Drawing Sheets

Transistor with low driving ability

FIG. 7A

Wg2 > Wg1
Transistor with high driving ability

FIG. 7B

Transistor with small capacitance of storage node

FIG. 8A

Sa2 > Sa1
Transistor with large capacitance of storage node

SEMICONDUCTOR INTEGRATED CIRCUIT DEVICE IN WHICH A MEASURE TO COUNTER SOFT ERRORS IS TAKEN

CROSS-REFERENCE TO RELATED APPLICATIONS

This application is based upon and claims the benefit of priority from prior Japanese Patent Application No. 2004-287698, filed Sep. 30, 2004, the entire contents of which are incorporated herein by reference.

BACKGROUND OF THE INVENTION

1. Field of the Invention

This invention relates to a semiconductor integrated circuit device and more particularly to a semiconductor integrated circuit device in which a measure to counter soft errors is taken.

2. Description of the Related Art

As the generation proceeds, the transistor size becomes smaller and the size of the latch circuit becomes smaller. Therefore, in the latch circuit, soft errors, for example, soft errors caused by α rays become significant. As one countermeasure against occurrence of the soft error, a method for increasing the storage node capacity of the latch circuit is provided. However, this method has a disadvantage that the size of the latch becomes large.

The soft error also occurs in the memory cell of the semiconductor memory, for example, in the memory cell of an SRAM. In the present semiconductor memory, an array (which is hereinafter referred to as a parity data portion) in which memory cells used to store data for error detection/correction, for example, parity data are arranged is additionally provided in addition to an array (which is hereinafter referred to as a normal data portion) in which memory cells used to store normal data are arranged. This is a so-called semiconductor memory with an ECC function. The semiconductor memory with the ECC function is described in Jpn. Pat. Appln. KOKAI Publication No. 2003-59290, for example.

However, when α rays are applied to the parity data portion to cause soft errors, it becomes impossible to determine whether data held in the normal data portion is true or not. Further, it is impossible to determine whether the soft error is generated in the normal data portion or in the parity data portion.

BRIEF SUMMARY OF THE INVENTION

A semiconductor integrated circuit device according to a first aspect of the present invention comprises a first memory circuit which stores normal data, a second memory circuit which stores determination information to determine whether a value of the normal data is changed, capacitance of a data storage node of the second memory circuit being larger than that of a data storage node of the first memory circuit, and a determination circuit which determines whether a value of the normal data is changed based on the determination information.

A semiconductor integrated circuit device according to a second aspect of the present invention comprises a first memory circuit which stores operation information, an even-odd determination circuit which determines one of even and odd numbers of operation information items stored in the first memory circuit, a second memory circuit which stores determination information used to determine which one of the even and odd numbers of operation information items stored in the first memory is true, capacitance of a data storage node of the second memory circuit being larger than that of a data storage node of the first memory circuit, and a determination circuit which determines whether a value of the operation information is changed based on the determination information.

A semiconductor integrated circuit device according to a third aspect of the present invention comprises a first memory circuit which stores operation information, a second memory circuit which stores an error correction code to correct an error occurring in the operation information, capacitance of a data storage node of the second memory circuit being larger than that of a data storage node of the first memory circuit, and an error correction processing circuit which corrects an error occurring in the operation information based on the error correction code.

DETAILED DESCRIPTION OF THE INVENTION

There will now be described embodiments of this invention with reference to the accompanying drawings. In this explanation, common reference symbols are attached to like portions throughout the drawings.

FIRST EMBODIMENT

Figure 1:
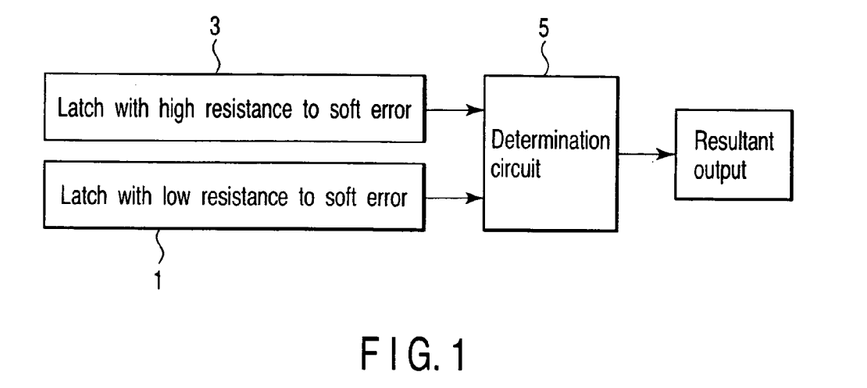
FIG. 1 is a block diagram showing an example of the basic configuration of a semiconductor integrated circuit device according to a first embodiment of this invention.

FIG. 1 is a block diagram showing an example of the basic configuration of a semiconductor integrated circuit device according to a first embodiment of this invention.

As shown in FIG. 1, the integrated circuit device according to the first embodiment includes latch circuits 1, 3. The latch circuit 1 has low resistance to soft errors and the latch circuit 3 has higher resistance to soft errors in comparison with the latch circuit 1. In the following explanation, the terms "low-resistance latch circuit 1" and "high-resistance latch circuit 3" are used.

For example, a determination circuit 5 compares data read out from the low-resistance latch circuit 1 with data read out from the high-resistance latch circuit 3 to determine whether the data is true or not. That is, the determination circuit 5 determines whether data held in the low-resistance latch circuit 1 is true or not based on data held in the high-resistance latch circuit 3.

Figure 2:
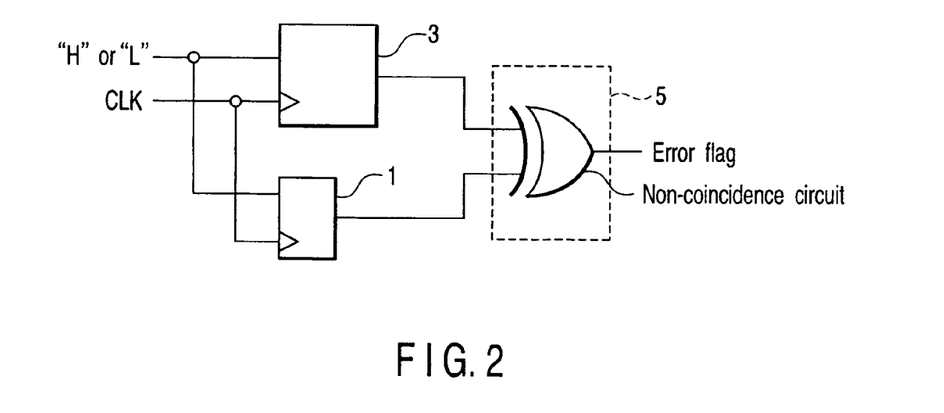
FIG. 2 is a circuit diagram showing a circuit example of the semiconductor integrated circuit device according to the first embodiment of this invention.

FIG. 2 is a circuit diagram showing a circuit example of the semiconductor integrated circuit device according to the first embodiment of this invention.

As shown in FIG. 2, one example of the difference between the low-resistance latch circuit 1 and the high-resistance latch circuit 3 is the size of the latch circuit, for example. In most cases, the capacitance of the storage node becomes larger as the size of the latch circuit is larger and the capacitance of the storage node becomes smaller as the size of the latch circuit is smaller. The magnitude of the capacitance of the storage node indicates the degree of soft error resistance. Based on this fact, it is assumed that the low-resistance latch circuit 1 indicates a small latch circuit and the high-resistance latch circuit 3 indicates a latch circuit which is larger than the low-resistance latch circuit 1. The same data of "H" or "L" is input to the low-resistance latch circuit 1 and high-resistance latch circuit 3 and, for example, input data is held in the low-resistance latch circuit 1 and high-resistance latch circuit 3 based on a clock CLK.

One example of the determination circuit 5 is a non-coincidence determination circuit, for example, an exclusive OR circuit. The exclusive OR circuit outputs an error flag "0" (for example, data is true and a soft error is not yet generated), for example, when data held in the low-resistance latch circuit 1 coincides with data held in the high-resistance latch circuit 3. Further, it outputs an error flag "1" (for example, data is false and a soft error is generated) when data held in the low-resistance latch circuit 1 does not coincide with data held in the high-resistance latch circuit 3. The determination circuit 5 is not limited to the exclusive OR circuit and any circuit which can determine coincidence or non-coincidence can be used.

Figure 3:
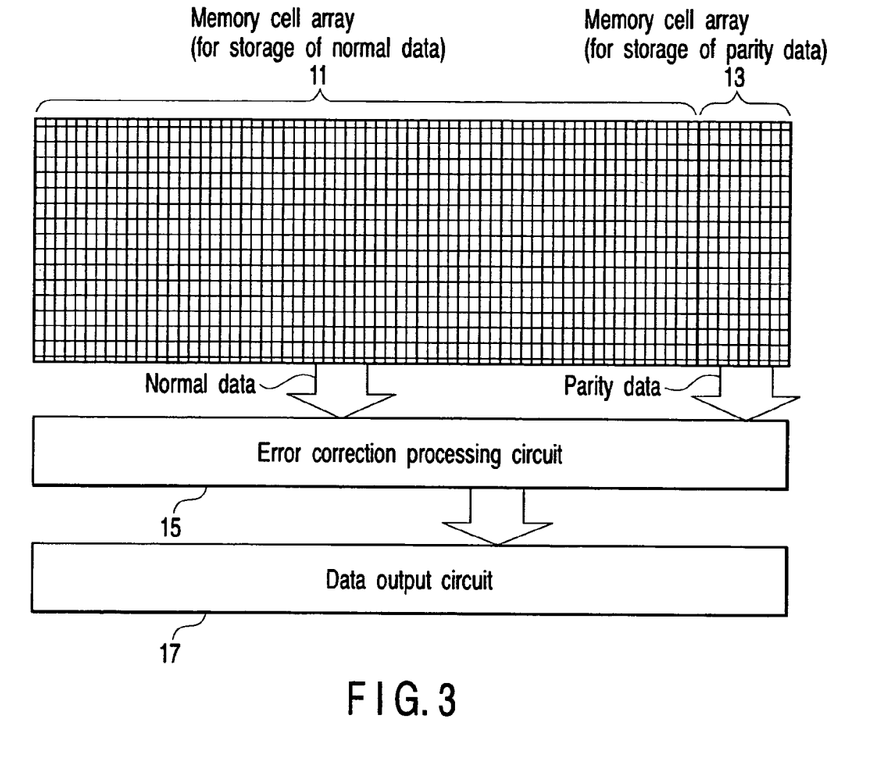
FIG. 3 is a block diagram showing an application example of the semiconductor integrated circuit device according to the first embodiment of this invention.

FIG. 3 is a block diagram showing an application example of the semiconductor integrated circuit device according to the first embodiment of this invention.

As shown in FIG. 3, the device according to the first embodiment can be applied to a semiconductor memory with an ECC function, for example. The semiconductor memory with the ECC function includes a normal data storage memory cell array 11 and parity data storage memory cell array 13 as memory cell arrays. In the following explanation, they are respectively called the normal data portion 11 and parity data portion 13.

Normal data read out from the normal data portion 11 and parity data read out from the parity data portion 13 are input to an error correction processing circuit 15. The error correction processing circuit 15 corrects an error of normal data according to an error correction code such as a humming code or BCH code when an error occurs in the normal data, for example. The normal data is input to a data outputting circuit 17 via the error correction processing circuit 15 and output to the exterior of the semiconductor memory.

Figure 16:
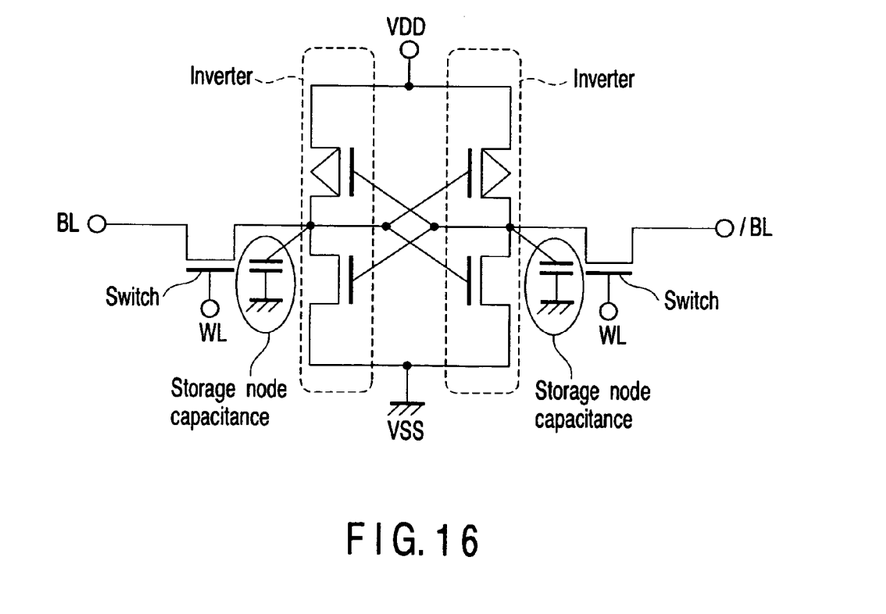
FIG. 16 is a diagram showing one example of a memory cell of a RAM.

Parity data stored in the parity data portion 13 is important data to correct an error of normal data. If parity data is destroyed, it becomes impossible to correctly perform the error correction process. Therefore, the device according to the first embodiment is applied to the parity data portion 13 to determine whether parity data is destroyed or not. One application example is attained by configuring the parity data portion 13 by use of a memory cell and a memory cell whose soft error resistance is higher than that of the above memory cell. They are respectively called a low-resistance memory cell and high-resistance memory cell. As indicated in the present application example, the storage element which holds data is not limited to the latch circuit and can be modified into a memory cell. One example of the SRAM memory cell is shown in FIG. 16.

Parity data is held in each of the low-resistance memory cell and high-resistance memory cell. When parity data is read out, the parity data is read out from each of the low-resistance memory cell and high-resistance memory cell and supplied via the determination circuit 5 shown in FIGS. 1 and 2 to determine whether the parity data is true or not.

When the determination circuit 5 determines that "parity data is not destroyed", the parity data is transmitted to the error correction processing circuit 15, the normal operation is performed and then normal data is output to the exterior.

On the other hand, if the determination circuit 5 determines that "parity data is destroyed", transmission of the parity data to the error correction processing circuit 15 is interrupted. Then, for example, a suitable operation such as a process for interrupting outputting of normal data to the exterior is performed. By performing the above suitable operation, for example, an influence on an electronic equipment system using the present semiconductor memory is previously prevented from becoming large.

Next, the circuit examples of the low-resistance latch circuit and high-resistance latch circuit are explained.

FIRST CIRCUIT EXAMPLE

Figure 4:
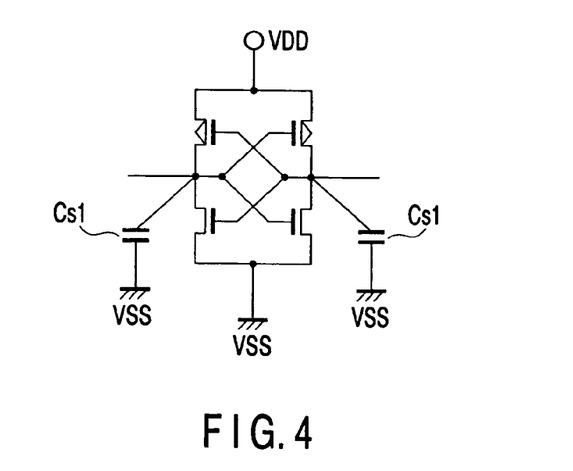
FIG. 4 is a circuit diagram showing a first circuit example of a latch circuit with low resistance.
Figure 5:
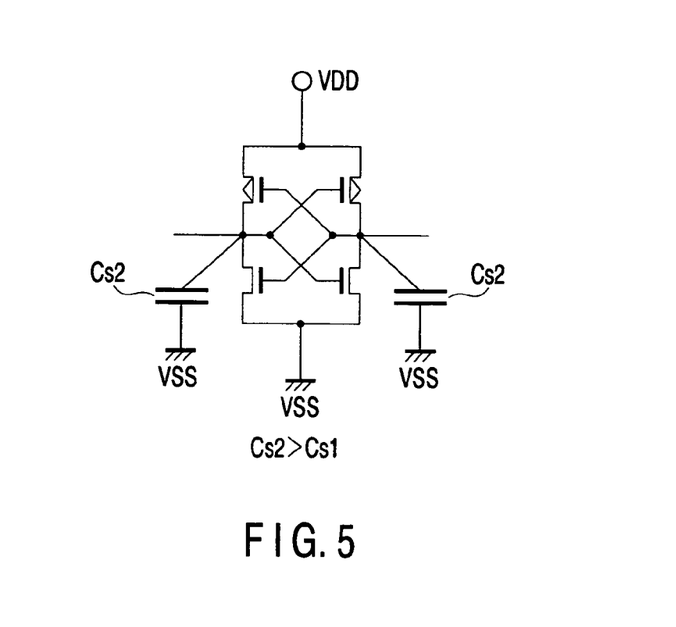
FIG. 5 is a circuit diagram showing a first circuit example of a latch circuit with high resistance.

FIG. 4 is a circuit diagram showing a first circuit example of the low-resistance latch circuit and FIG. 5 is a circuit diagram showing a first circuit example of the high-resistance latch circuit.

As shown in FIGS. 4 and 5, the difference between the low-resistance latch circuit and high-resistance latch circuit lies in the capacitance of the storage node. In this example, the capacitance of the storage node of the low-resistance latch circuit is "Cs1". On the other hand, the capacitance of the storage node of the high-resistance latch circuit is "Cs2" and, in this case, "Cs2>Cs1". In order to form a high-resistance latch circuit, it is only necessary to attach capacitance larger than the capacitance of the low-resistance latch circuit to the storage node of the circuit. One example of the capacitance can be attained by a capacitor, for example. The low-resistance latch circuit and high-resistance latch circuit can be attained in one integrated circuit chip by attaching capacitors of different capacitances to the storage nodes.

An advantage attained by the first circuit example is that the size of the transistor configuring the low-resistance latch circuit and the size of the transistor configuring the high-resistance latch circuit can be set equal to each other.

SECOND CIRCUIT EXAMPLE

Figure 6:
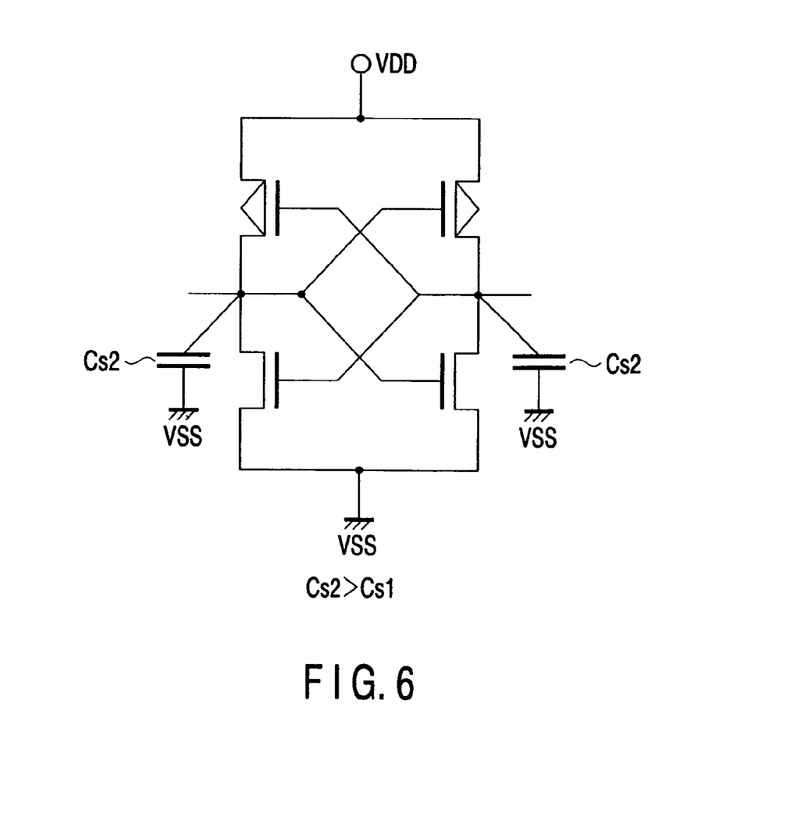
FIG. 6 is a circuit diagram showing a second circuit example of the latch circuit with high resistance.

FIG. 6 is a circuit diagram showing a second circuit example of the high-resistance latch circuit.

As shown in FIG. 6, in the high-resistance latch circuit of the second circuit example, the size of a transistor configuring the high-resistance latch circuit is made larger than the size of a transistor configuring the low-resistance latch circuit. As the size of the transistor becomes larger, the capacitance "Cs2" of the storage node increases to form a high-resistance latch circuit. An example in which the size of the transistor is changed is explained below.

Figure 7A:
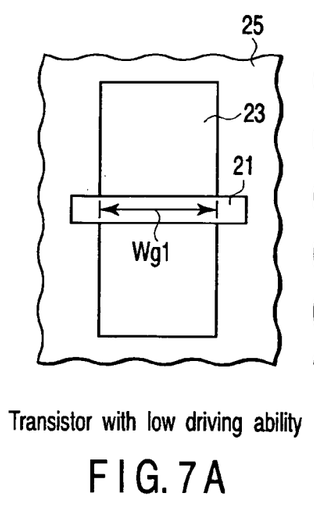
FIG. 7A is a plan view showing a transistor with low driving ability.
Figure 7B:
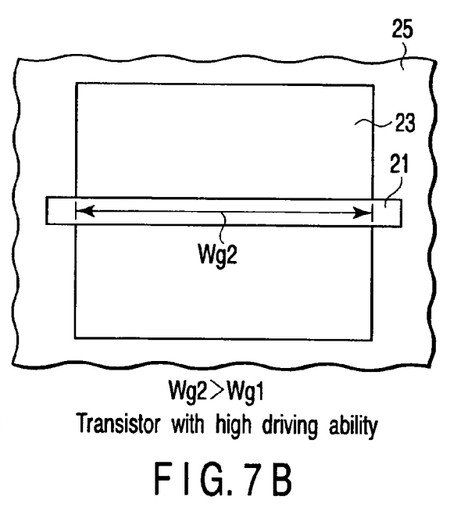
FIG. 7B is a plan view showing a transistor with high driving ability.

FIG. 7A is a plan view showing a transistor with low-level driving ability and FIG. 7B is a plan view showing a transistor with high-level driving ability.

As shown in FIGS. 7A, 7B, in the example in which the size of the transistor is changed, various degrees of the driving ability are provided. The driving ability of the transistor, particularly, the current driving ability depends on the gate width Wg of a gate electrode 21. As the gate width Wg becomes smaller, the current driving ability becomes lower and as the gate width Wg becomes larger, the current driving ability becomes higher. In this example, the gate width of the transistor having the low driving ability is "Wg1" (FIG. 7A). Further, the gate width of the transistor having the high driving ability is "Wg2" (FIG. 7B) and "Wg2>Wg1". For example, the gate width Wg is determined by the width of an element region 23 defined by an element isolation region 25 on the integrated circuit chip. That is, when the gate width Wg is changed, the shape of the element region 23 is changed. The element region 23 acts as a source region (or a drain region) of the transistor. If the shape of the source region (or the shape of the drain region) of the transistor is changed, the shape of the storage node is changed and the capacitance attached to the storage node is changed.

Figure 8A:
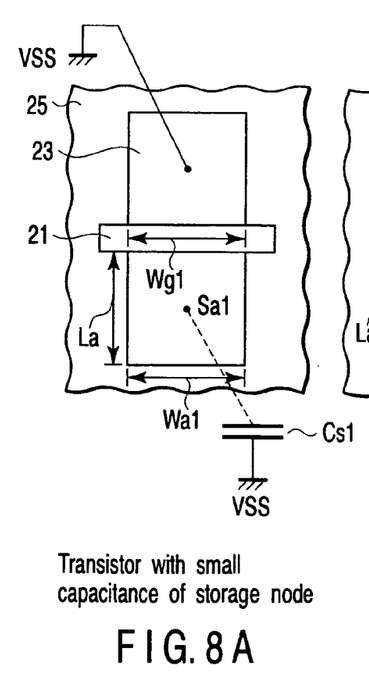
FIG. 8A is a plan view showing a transistor with low driving ability.
Figure 8B:
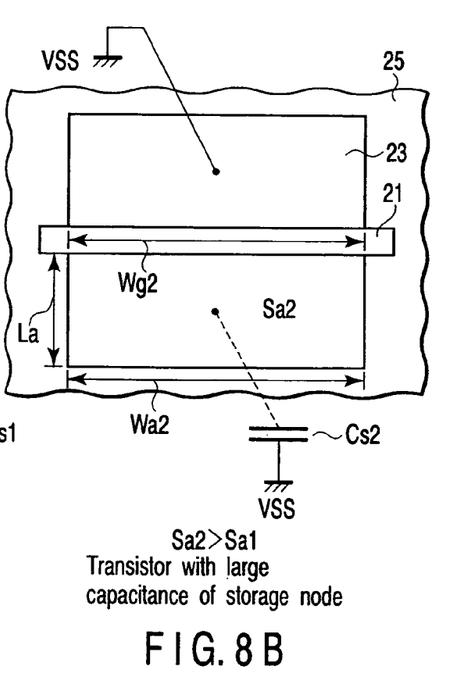
FIG. 8B is a plan view showing a transistor with high driving ability.

For example, as shown in FIGS. 8A and 8B, the lengths of the source region (or the drain region) along the gate lengthwise direction are set to "La" and the lengths thereof along the gate width direction are set to "Wa1" and "Wa2".

The area of the source region (or the drain region) of the transistor shown in FIG. 8A is "La×Wa1 =Sa1" and the area of the source region (or the drain region) of the transistor shown in FIG. 8B is "La×Wa2 =Sa2". In this example, since the gate width Wg is set to satisfy the relation of "Wg2>Wg1", the length Wa of the source region (or drain region) in the gate width direction is set to satisfy the relation of "Wa2>Wa1". Therefore, the area Sa of the source region (or drain region) is set to satisfy the relation of "Sa2>Sa1" and the capacitance Cs2 of the storage node of the transistor shown in FIG. 8B becomes larger than the capacitance Cs1 of the storage node of the transistor shown in FIG. 8A. Thus, the capacitance of the storage node can be changed by changing the size of the transistor and a low-resistance latch circuit and high-resistance latch circuit can be formed in one integrated circuit chip.

The advantage attained by the second circuit example is that it is not necessary to separately provide a capacitor in the first circuit example.

Further, in the second circuit example, the length La of the source region (or drain region) in the gate length direction is fixed and the length Wa of the source region (or drain region) in the gate width direction is changed to change the area Sa. However, this is not limitative and the length Wa can be fixed and the length La can be changed to change the area Sa. In addition, both of the length Wa and length La can be changed to change the area Sa.

The first and second circuit examples can be adequately selected according to the layout of the integrated circuit chip, for example.

SECOND EMBODIMENT

Figure 9:
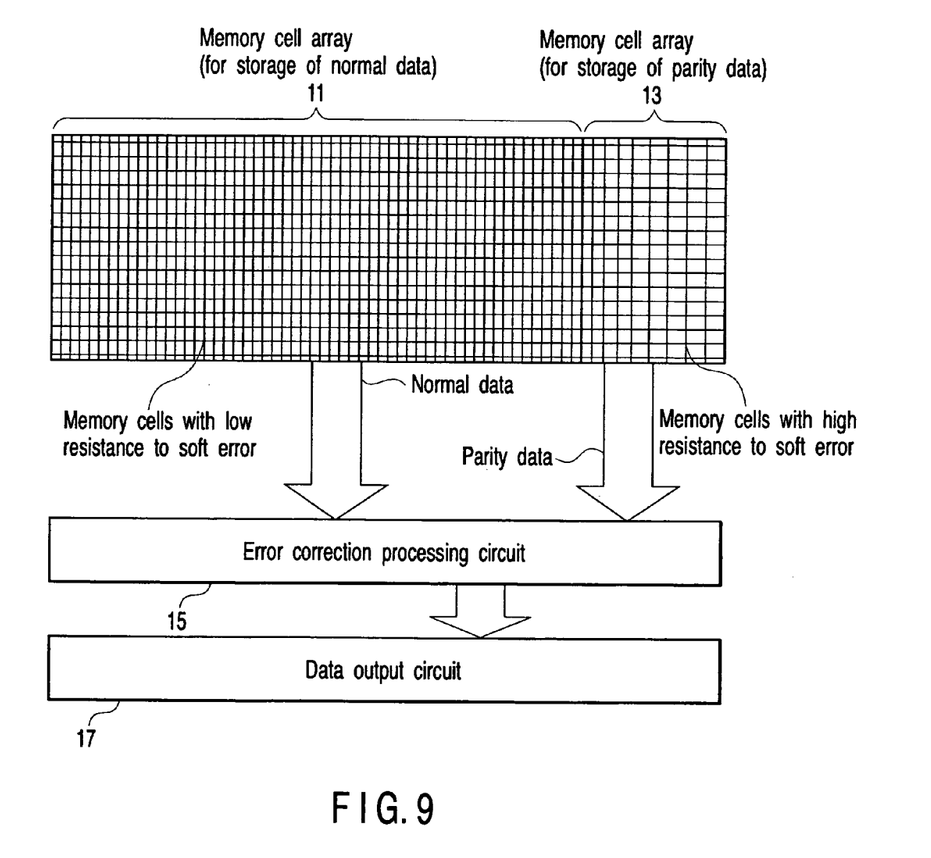
FIG. 9 is a block diagram showing an example of the basic configuration of a semiconductor integrated circuit device according to a second embodiment of this invention.

FIG. 9 is a block diagram showing an example of the basic configuration of a semiconductor integrated circuit device according to a second embodiment of this invention.

As shown in FIG. 9, the device according to the second embodiment is a semiconductor memory with an ECC function. The device according to the second embodiment is different from the device explained in the application example of the first embodiment in that memory cells having low resistance to soft errors are arranged in a normal data portion 11 and memory cells having high resistance to soft errors are arranged in a parity data portion 13. With this configuration, the parity data portion 13 becomes highly resistant to soft errors in comparison with the normal data portion 11.

Figure 10:
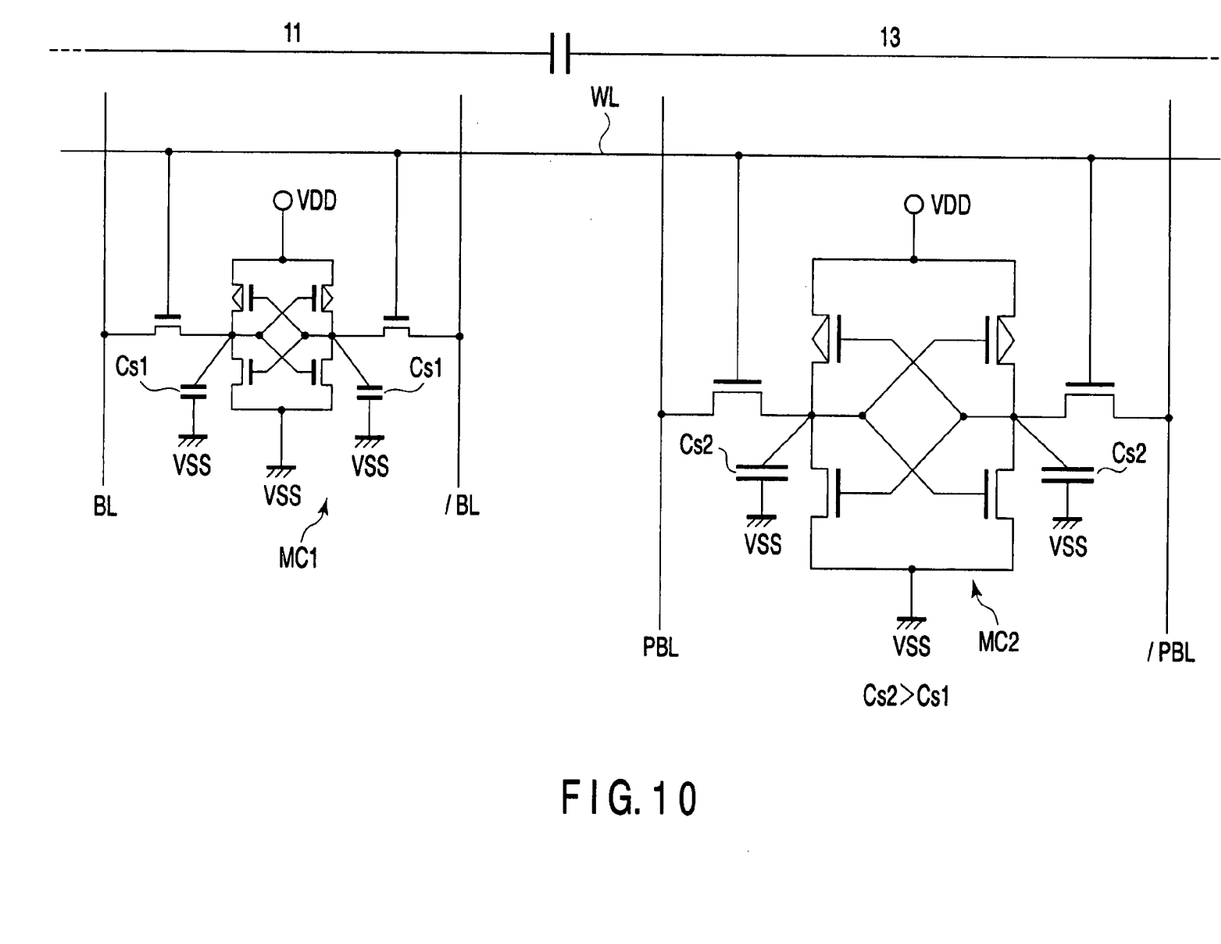
FIG. 10 is a circuit diagram showing a circuit example of the semiconductor integrated circuit device according to the second embodiment of this invention.

FIG. 10 is a circuit diagram showing a circuit example of the semiconductor integrated circuit device according to the second embodiment of this invention.

As shown in FIG. 10, the circuit example indicates an SRAM as the semiconductor memory. The memory cell of the SRAM is a latch circuit. As the latch circuits, the low-resistance latch circuits and high-resistance latch circuits explained in the first embodiment are used. In this circuit example, a latch circuit having transistors whose size is reduced is used as the low-resistance latch circuit and a latch circuit having transistors whose size is enlarged is used as the high-resistance latch circuit. Latch circuits MC1 each having transistors whose size is reduced are arranged in the normal data portion 11 which is required to have large memory capacity and thus the memory cells are miniaturized to attain large memory capacity. On the other hand, latch circuits MC2 each having transistors whose size is enlarged are arranged in the parity data portion which is not required to have memory capacity larger than that of the normal data portion 11 to enhance the soft error resistance rather than the integration density.

The latch circuits MC1 and MC2 are commonly connected to a word line WL. When the word line WL is selected, normal data held in the latch circuit MC1 and parity data held in the latch circuit MC2 are read out to a normal bit line BL and parity bit line PBL, respectively.

According to the second embodiment, the latch circuits MC1 having the small memory cells, for example, small transistors are arranged in the normal data portion 11 to increase the memory capacity. Further, the latch circuits MC2 having the large memory cells, for example, large transistors are arranged in the parity data portion 13. As a result, it becomes difficult for soft errors to occur in the parity data portion 13. Therefore, even when soft errors occur in the normal data portion 11, data which is destroyed by the soft error occurring in the normal data portion 11 can be corrected in an error correction processing circuit 15. In this case, since soft errors are difficult to occur in the parity data portion 13, the error correction (compensation) rate can be enhanced in comparison with a device having the same type of memory cells arranged in the normal data portion 11 and parity data portion 13.

THIRD EMBODIMENT

The third embodiment relates to a semiconductor memory with fuses and more particularly to an example in which occurrence of soft errors in a fuse latch circuit can be detected. The fuse latch circuit is a memory circuit which latches operation information of the integrated circuit, for example, replacement information (redundancy information) for a faulty portion of the semiconductor memory.

Figure 11:
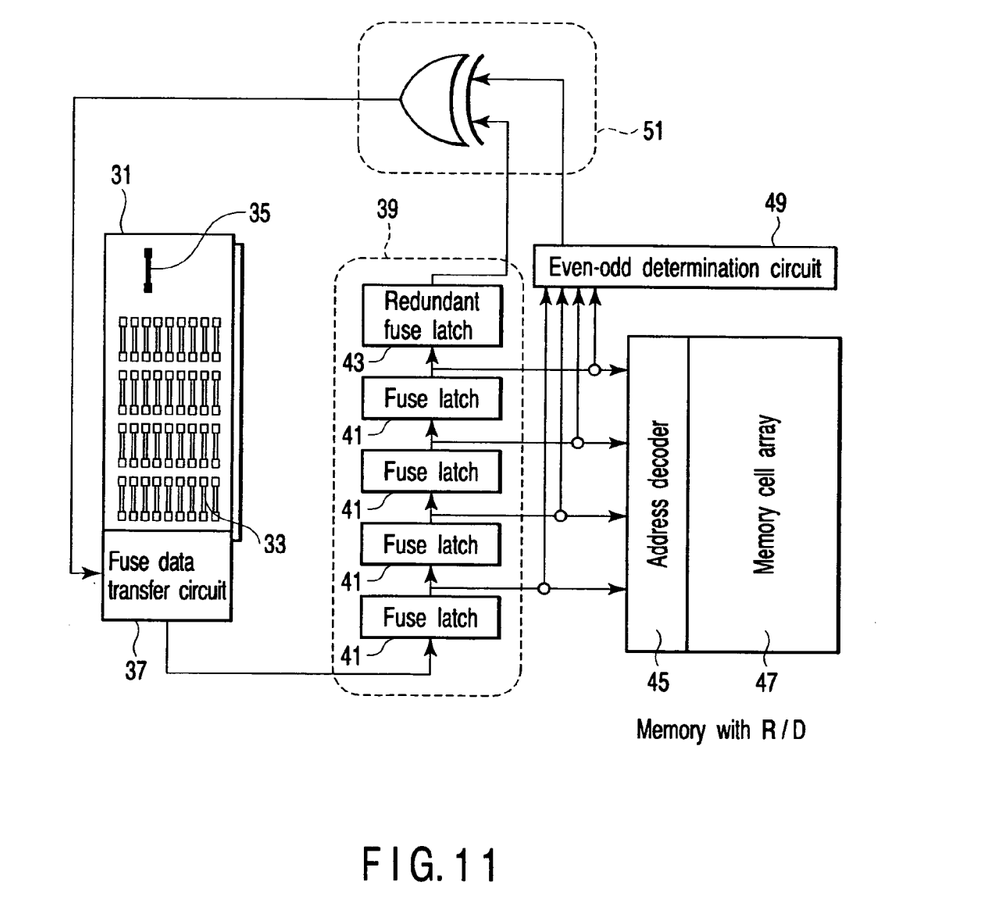
FIG. 11 is a block diagram showing an example of the basic configuration of a semiconductor integrated circuit device according to a third embodiment of this invention.

FIG. 11 is a block diagram showing an example of the basic configuration of a semiconductor integrated circuit device according to the third embodiment of this invention.

As shown in FIG. 11, operation information is programmed in fuses 33 arranged in a fuse box 31. The fuse box 31 is formed on a semiconductor integrated circuit chip. In the fuses 33, fuses to electrically store information and fuses to physically store information are contained. As the fuses to physically store information, fusing type fuses, for example, fuses of laser fusing type or electrically fusing type are used. The fusing type fuse stores information by mechanically destroying the electrical path. In the case where the above fuses are used, the fuse box 31 is arranged in a portion far apart from the integrated circuit portion. This is because the integrated circuit portion is prevented from being inadvertently destroyed at the time of fusing of the fuse. However, if the fuse box 31 is separated far apart from the integrated circuit portion, it takes time to access the fuse box 31 and the operation becomes slow. In order to prevent this, the fuse latch circuit is arranged near the integrated circuit portion and, for example, operation information is read out from the fuse box 31 at the turn-ON time of the power supply switch and latched into the fuse latch circuit. Since the fuse latch circuit is arranged nearer to the integrated circuit portion than the fuse box 31 or arranged inside the integrated circuit portion, it does not take a long time to make access. As a concrete example of the fuse latch circuit, for example, a shift register 39 having fuse latch circuits 41 connected in series is provided. The shift register 39 is hereinafter referred to as a fuse data transfer shift register 39.

Operation information in this example is information, that is, redundancy information which is used to replace a faulty portion of the semiconductor memory, for example, a faulty portion of the memory cell array by a spare portion (redundant memory cell array, and/or redundant column and/or redundant row). For example, when the power supply switch is turned ON, a fuse data transfer circuit 37 connected to the fuse box 31 is operated, redundancy information programmed in the fuses 33 is transferred to and latched in the fuse data transfer shift register 39. One example of the integrated circuit portion is a semiconductor memory with a redundant function (memory with R/D) and redundancy information latched in the fuse latch circuit 41 is output to an address decoder 45, for example. In the address decoder 45, normal columns in the memory cell array 47 and/or a normal decoder which selects the row, spare columns in the memory cell array 47 and/or spare decoder (redundant decoder) which selects the row are provided. When an input address is an address which specifies a faulty portion on the memory cell array 47, the address decoder 45 activates the spare decoder instead of the normal decoder to select the spare column and/or row. The redundancy information includes address information corresponding to the faulty portion, for example.

The redundancy information in this example is serially input to the fuse data transfer shift register 39. In the shift register 39, a preset number of fuse latch circuits 41 are contained. Information latched in the fuse latch circuit 41 has a value of "H" or "L". Whether the information is destroyed or not can be detected by the following manner, for example.

Whether the number of values "H", for example, latched in the fuse latch circuit 41 is even or odd is determined by use of an even-odd determining circuit 49. For example, if information is normal when the number is even, it is indicated that the information is destroyed when the number is changed to an odd number. On the other hand, if information is normal when the number is odd, it is indicated that the information is destroyed when the number is changed to an even number. Error determination information relating to the fact that information is normal when the number is even or odd is programmed in a redundant fuse 35 which is provided in the fuse box 31. For example, the error determination information is transferred to the fuse data transfer shift register 39 together with operation information from the redundant fuse 35 at the turn-ON time of the power supply switch. The thus transferred error determination information is latched in the redundant fuse latch circuit 43 provided in the fuse data transfer shift register 39. The redundant fuse latch circuit 43 is used as the high-resistance latch circuit. On the other hand, the fuse latch circuit 41 is used as the low-resistance latch circuit. The number of fuse latch circuits 41 is larger than the number of redundant fuse latch circuits 43. Therefore, the fuse latch circuits 41 are used as the low-resistance latch circuits to attain miniaturization and enhance the integration density.

An output of the redundant fuse latch circuit 43 and an output of the even-odd determination circuit 49 are input to inputs of a comparing circuit 51. The comparing circuit 51 corresponds to the determination circuit 5 of the first embodiment and includes a non-coincidence determination circuit, for example. One example of the non-coincidence determination circuit is an exclusive OR circuit like the first embodiment. The comparing circuit 51 determines that information in the fuse data transfer shift register 39 is destroyed when the output of the redundant fuse latch circuit 43 becomes non-coincident with the output of the even-odd determination circuit 49. Then, it outputs an error flag to the fuse data transfer circuit 37. The fuse data transfer circuit 37 receives the error flag and latches the operation information in the fuse data transfer shift register 39 again.

According to the third embodiment, the redundant fuse 35 is provided in the fuse box 31 and error determination information is programmed in the redundant fuse 35. Further, for example, the redundant fuse latch circuit 43 is provided in the fuse data transfer shift register 39 and the error determination information is transferred to and latched in the redundant fuse latch circuit 43. Then, the error determination information is compared with information indicating the even or odd number of operation information items latched in the fuse latch circuits 41 provided in the fuse data transfer shift register 39. As a result, whether the operation information is destroyed or not can be determined.

Further, the redundant fuse latch circuit 43 is formed as a high-resistance latch circuit in which soft errors are more difficult to occur than in the fuse latch circuit 41. As a result, it becomes possible to detect whether a soft error occurs in the fuse latch circuit 41 or not.

In addition, in the third embodiment, when a soft error occurs in the fuse latch circuit 41, operation information programmed in the fuses 33 is latched again in the fuse latch circuit 41. As a result, a soft error occurring in the fuse latch circuit 41 can be corrected by itself.

FOURTH EMBODIMENT

Like the third embodiment, the fourth embodiment relates to a semiconductor memory with a fuse latch circuit.

Figure 12:
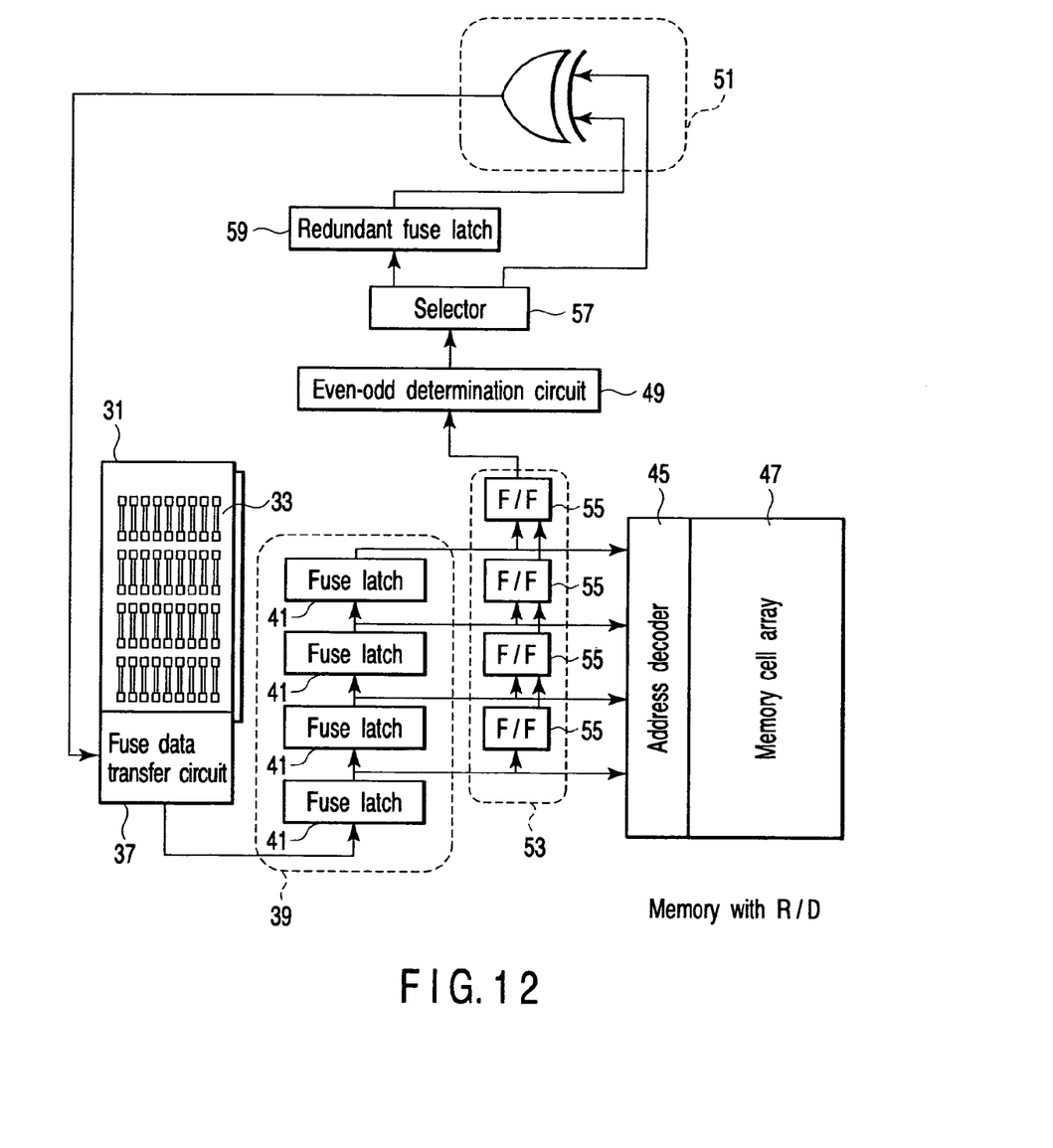
FIG. 12 is a block diagram showing an example of the basic configuration of a semiconductor integrated circuit device according to a fourth embodiment of this invention.

FIG. 12 is a block diagram showing an example of the basic configuration of a semiconductor integrated circuit device according to the fourth embodiment of this invention.

As shown in FIG. 12, the fourth embodiment is different from the third embodiment in that operation information programmed in a fuse box 31 is read out, whether, for example, the number of values "H" or "L" of the readout operation information is even or odd is determined in an even-odd determination circuit 49 and the determination result is used as error determination information. The error determination information is latched in a redundant fuse latch circuit 59. The redundant fuse latch circuit 59 is a high-resistance latch circuit.

In the fourth embodiment, since error determination information is generated when redundancy information is read out from the fuse box 31, it is not necessary to provide the redundant fuse 35 in the fuse box 31 unlike the third embodiment. Therefore, for example, in the fourth embodiment, it is possible to simplify the program process with respect to the fuse box 31 in comparison with a case of the third embodiment.

According to the fourth embodiment, since the program process can be simplified, for example, the following advantages can be further attained in addition to the advantage obtained in the third embodiment.

(1) The probability of occurrence of program errors with respect to the fuse box 31, for example, laser blow errors with respect to the fuses 33 and redundant fuse 35 can be lowered and the manufacturing yield can be enhanced.

(2) Time required for programming into the fuse box 31 can be made shorter and the throughput in the semiconductor manufacturing factory can be enhanced.

(3) Since the redundant fuse 35 is not necessary, the number of fuses 33 formed in the fuse box 31 can be suppressed and the area of the fuse box 31 can be reduced.

(4) When the number of fuses 33 in the fourth embodiment is made equal to the sum of the number of fuses 33 and the number of fuses 35 in the third embodiment, that is, the total number of fuses, the amount of operation information items which can be programmed in the fuses 33 can be increased.

Next, the operation example of the device according to the fourth embodiment is explained.

First, the power supply switch of the device according to the fourth embodiment is turned ON. After a power supply turn-ON detection circuit (not shown) of the device according to the fourth embodiment or a fuse data transfer circuit 37 detects that the power supply is turned ON, for example, the fuse data transfer circuit 37 serially reads out operation information programmed in the fuse box 31, for example, redundancy information. The readout redundancy information is serially transferred to the fuse data transfer shift register 39, for example, and sequentially latched into a plurality of fuse latch circuits 41 provided in the shift register 39.

After the redundancy information is latched into the shift register 39, the redundancy information is transferred in parallel, for example, to a second fuse data transfer shift register 53 and simultaneously latched into a plurality of flip-flop circuits 55 provided in the shift register 53.

After the redundancy information is latched into the shift register 53, for example, the redundancy information is serially read out from the shift register 53 and serially input to an even-odd determination circuit 49.

The even-odd determination circuit 49 counts the number of values "H" or "L" based on the input redundancy information, for example. The result of counting is used as error determination information. The error determination information obtained in the even-odd determination circuit 49 is input to a selector 57. The selector 57 inputs the error determination information to a redundant fuse latch circuit 59. The redundant fuse latch circuit 59 latches the input error determination information.

By the above operation, error determination information is latched in the redundant fuse latch circuit 59. After this, the device according to the fourth embodiment is set into the normal operation mode.

In the normal operation mode, redundancy information items latched in the fuse latch circuits 41 are input to an address decoder 45. The address decoder 45 detects whether the input address hits the faulty address or not based on the redundancy information. If the input address does not hit the faulty address, the address decoder 45 accesses a normal portion of the memory cell array 47. On the other hand, if the input address hits the faulty address, the address decoder 45 accesses a spare portion instead of a normal portion of the memory cell array 47. For example, the spare portion is a spare memory cell array (redundant memory cell array), spare row (redundant row) or spare column (redundant column).

Further, the redundancy information items latched in the fuse latch circuits 41 in the normal operation mode are latched into a plurality of flip-flop circuits 55 provided in the shift register 53. For example, after the redundancy information latched in the shift register 53 is latched in the shift register 53 at preset intervals, the redundancy information items are read out from the shift register 53 and serially input to the even-odd determination circuit 49, for example. The even-odd determination circuit 49 counts the number of values "H" or "L" based on the input redundancy information, for example. The result of counting is used as even-odd information in the normal operation mode. The even-odd information is input to a selector 57. The selector 57 inputs the even-odd information to a comparing circuit 51.

The comparing circuit 51 compares the even-odd information with the error determination information. As the result of comparison, if it is detected that the even-odd information is non-coincident with the error determination information, it is determined that the redundancy information latched in the fuse data transfer shift register 39 is destroyed. In this case, like the third embodiment, the comparing circuit 51 outputs an error flag to the fuse data transfer circuit 37. For example, when non-coincidence occurs, an error flag is output to the fuse data transfer circuit 37. Thus, the error flag is input to the fuse data transfer circuit 37. The fuse data transfer circuit 37 receives the error flag and latches the redundancy information into the fuse data transfer shift register 39 again.

Thus, in the fourth embodiment, when destruction of operation information, for example, redundancy information latched in the fuse data transfer shift register 39 occurs, the destroyed redundancy information is corrected by itself.

FIFTH EMBODIMENT

Figure 13:
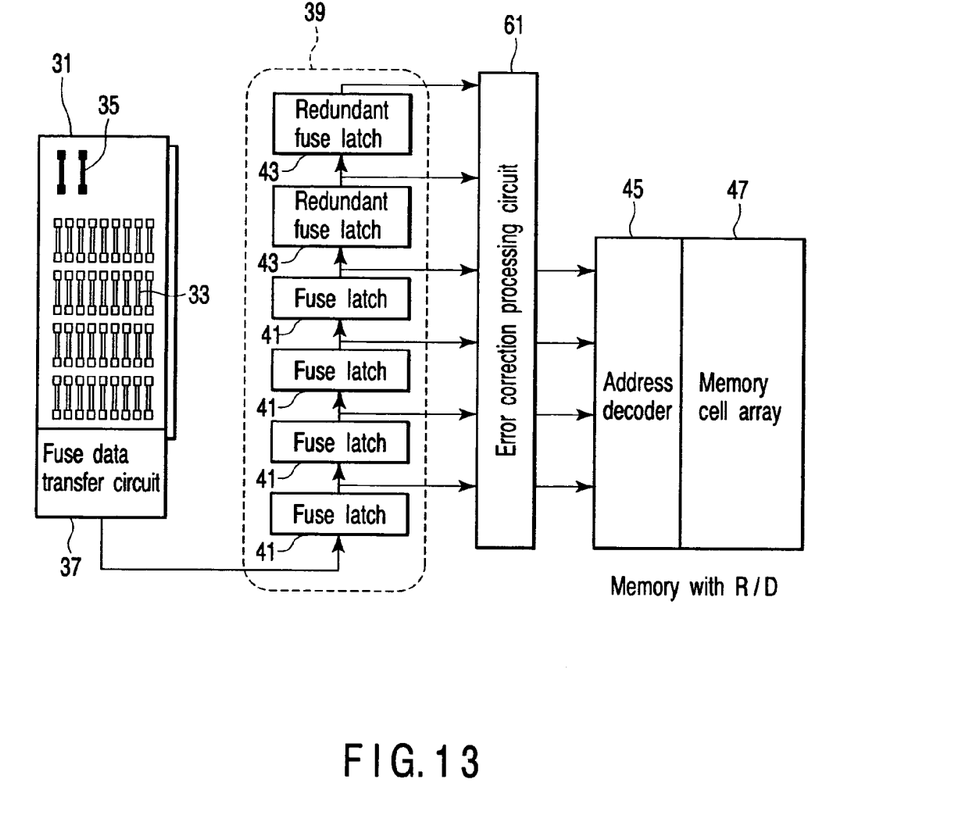
FIG. 13 is a block diagram showing an example of the basic configuration of a semiconductor integrated circuit device according to a fifth embodiment of this invention.

FIG. 13 is a block diagram showing an example of the basic configuration of a semiconductor integrated circuit device according to a fifth embodiment of this invention.

In the fifth embodiment, parity data of operation information is programmed into a fuse box 31. As a result, when operation information latched in a fuse data transfer shift register 39 is destroyed, the destroyed operation information can be error-corrected.

In this example, operation information is programmed in fuses 33 and parity data is programmed into redundant fuses 35. The parity data is read out together with the operation information from the fuse box 31 at the turn-ON time of the power supply and latched into the fuse data transfer shift register 39. In this example, operation information is latched into a fuse latch circuit 41 and parity data is latched into a redundant fuse latch circuit 43. The fuse latch circuit 41 is a low-resistance latch circuit and the redundant fuse latch circuit 43 is a high-resistance latch circuit.

Operation information and parity data are read out from the fuse data transfer shift register 39 and input to an error correction processing circuit 61. When an error occurs in the operation information, the error correction processing circuit 61 corrects the error based on the parity data.

According to the fifth embodiment, the redundant fuses 35 are provided in the fuse box 31 and error correction information of operation information, for example, parity data is programmed into the redundant fuses 35. Further, for example, the redundant fuse latch circuits 43 are provided in the fuse data transfer shift register 39 and the parity data is transferred to and latched in the redundant fuse latch circuits 43. When an error occurs in the operation information or redundancy information latched in the fuse latch circuit 41, the error correction processing circuit 61 corrects the thus generated error according to the parity data.

The redundant fuse latch circuit 43 is formed as a high-resistance latch circuit in which a soft error is more difficult to occur than in the fuse latch circuit 41. Thus, the parity data is difficult to be influenced by the soft error and when a soft error occurs in the fuse latch circuit 41, an error correction process can be performed.

In the fifth embodiment, a soft error occurring in the fuse latch circuit 41 can be corrected by itself.

SIXTH EMBODIMENT

For example, the semiconductor integrated circuit device explained in the first embodiment can be used as one circuit element of various integrated circuits and the semiconductor integrated circuit device explained in the second embodiment can be used as the basic configuration of a semiconductor memory with an ECC. Further, the semiconductors with the fuses explained in the third to fifth embodiments can be used as semiconductor memory products or used in the memory portion of a semiconductor integrated circuit device, for example, a processor, system LSI or the like which contains a semiconductor memory.

An electronic equipment utilizing the semiconductor integrated circuit device according to the above embodiments is explained as the sixth embodiment. In the sixth embodiment, a portable electronic device such as a digital still camera is shown as one example of the electronic equipment. However, the electronic equipment is not limited to the digital still camera.

Figure 14:
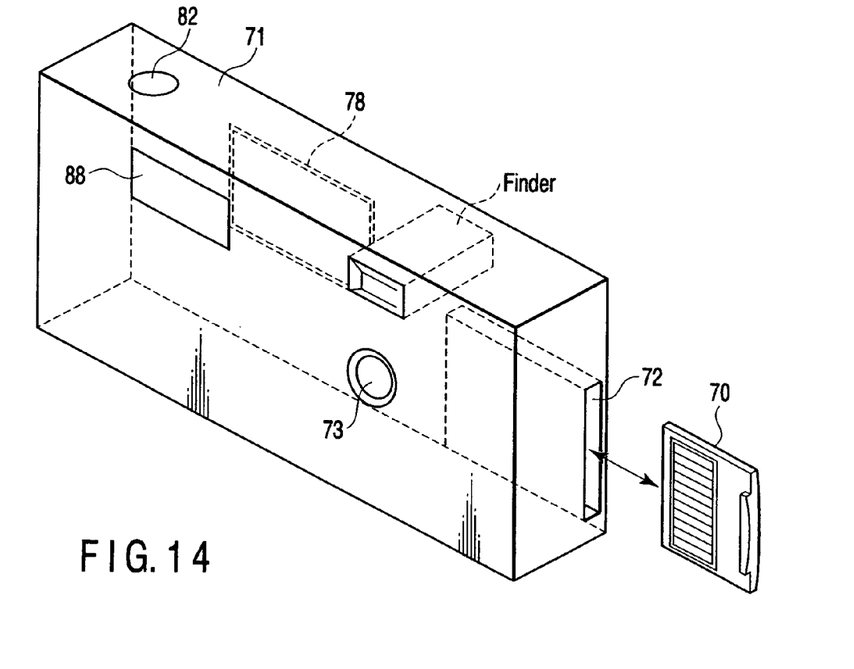
FIG. 14 is a perspective view showing one example of a digital camera.

FIG. 14 is a perspective view showing one example of a digital camera.

As shown in FIG. 14, a card slot 72 is formed in the casing of a digital still camera 71 and a circuit substrate connected to the card slot 72 is contained in the casing of the digital still camera 71. The circuit substrate is omitted and is not shown in FIG. 14. A memory card 70 can be removably inserted into the card slot 72 of the digital still camera 71. When the memory card 70 is inserted into the card slot 72, it is electrically connected to the electronic circuit on the circuit substrate.

Figure 15:
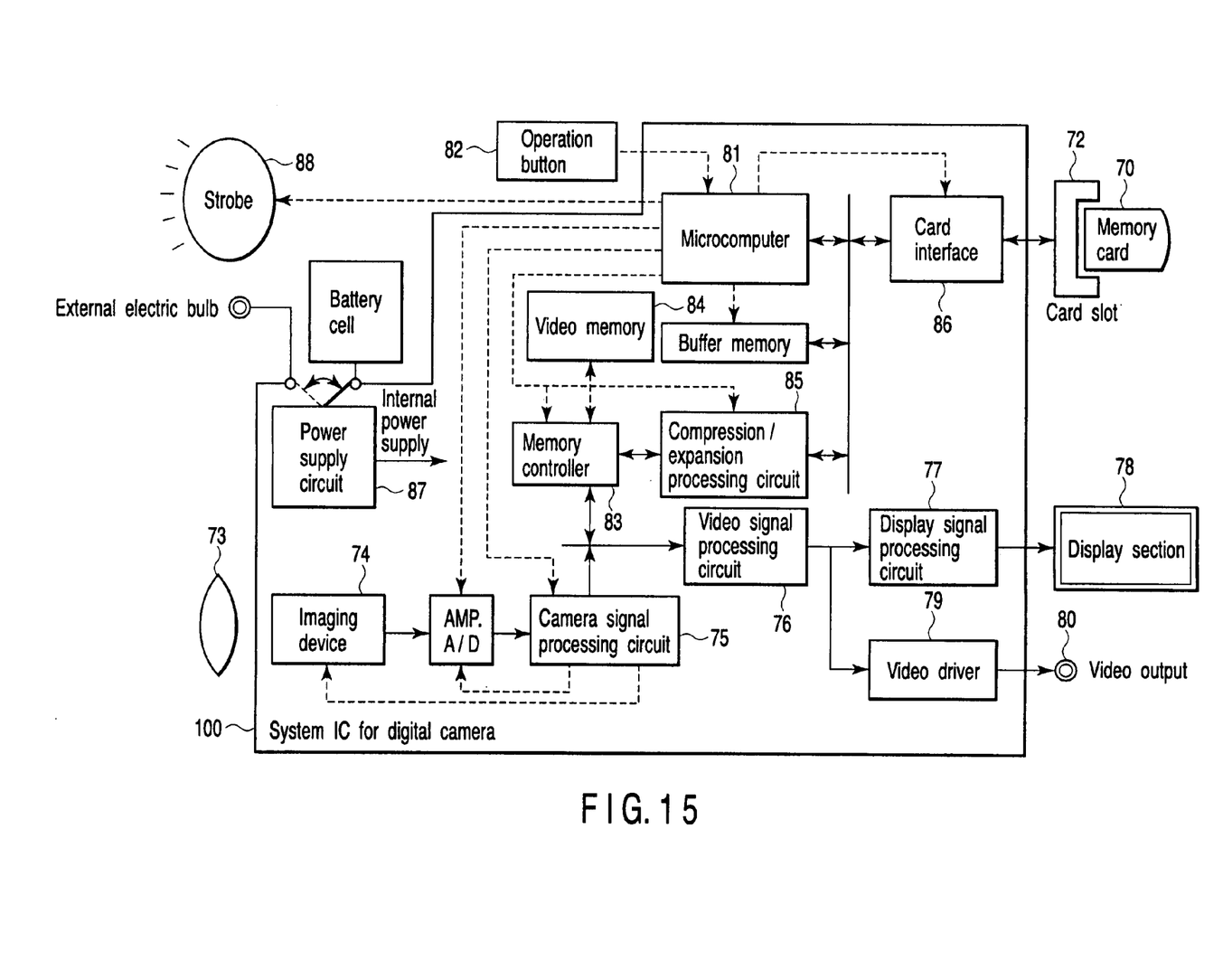
FIG. 15 is a block diagram showing an example of a system of a digital still camera.

FIG. 15 is a block diagram showing an example of a system of the digital still camera.

Light from a subject is converged by a lens 73 and made incident on an imaging device 74. The imaging device 74 photo-electrically converts the incident light into an analog signal, for example. One example of the imaging device 74 is a CMOS image sensor. The analog signal is amplified by an analog amplifier (AMP.) and then converted into a digital signal by an A/D converter (A/D). The digital signal is input to a camera signal processing circuit 75, subjected to an automatic exposure control process (AE), automatic white balance control process (AWB) and color separation process and then converted into a luminance signal and color difference signal, for example.

When an image is monitored, a signal output from the camera signal processing circuit 75 is input to a video signal processing circuit 76 and converted into a vide signal. As a form of the video signal, an NTSC (National Television System Committee) form can be provided. The video signal is output to a display section 78 mounted on the digital still camera 71 via a display signal processing circuit 77. One example of the display section 78 is a liquid crystal monitor.

Further, the video signal is output to a video output terminal 80 via a video driver 79. An image photographed by the digital still camera 71 can be output to an imaging equipment, for example, a display unit of a personal computer or television via the video output terminal 80. Thus, it is also possible to enjoy the photographed image on a device other than the display section 78. The imaging device 74, analog amplifier (AMP.), A/D converter (A/D) and camera signal processing circuit 75 are controlled by a microcomputer 81.

When an image is captured, an operation button, for example, an operation button 82 is depressed. Thus, the microcomputer 81 controls a memory controller 83 to permit a signal output from the camera signal processing circuit 75 to be written into a video memory 84 as a frame image. The frame image written into the video memory 84 is compressed based on a preset compression format by a compression/expansion processing circuit 85 and recorded on the memory card 70 mounted on the card slot 72 via a card interface 86.

When the recorded image is reproduced, the image recorded on the memory card 70 is read out via the card interface 86, expanded by the compression/expansion processing circuit 85 and then written into the video memory 84. The thus written image is input to the video signal processing circuit 76 and displayed on the display section 78 and image equipment like a case wherein the image is monitored.

In this system example, a case wherein the card slot 72, imaging device 74, analog amplifier (AMP.), A/D converter (A/D), camera signal processing circuit 75, video signal processing circuit 76, display signal processing circuit 77, video driver 79, microcomputer 81, memory controller 83, video memory 84, compression/expansion processing circuit 85 and card interface 86 are mounted on a circuit substrate 100 is shown. In this case, it is not necessary to mount the card slot 72 on the circuit substrate 100, but the card slot 72 can be connected to the circuit substrate 100 via a connector cable or the like. Further, in this example, a power supply circuit 87 is mounted on the circuit substrate 100. The power supply circuit 87 supplies internal power supply voltage used in the digital still camera 71 in response to power supply voltage supplied from the external power supply or battery cell. One example of the power supply circuit 87 is a DC-DC converter. The internal power supply voltage is supplied to the respective circuits as operation power supply voltage thereof and as power supply voltages for a strobe 88 and display section 78.

For example, the semiconductor integrated circuit device explained in the first embodiment can be used in one circuit element of the integrated circuit used in the digital still camera, for example, in part of the latch circuit.

For example, in the digital still camera, a microcomputer product is used. Particularly, the semiconductor integrated circuit device explained in the first embodiment can be used in the latch circuit of the microcomputer chip and the semiconductor integrated circuit device explained in the second to fifth embodiments can be used in the memory circuit of the microcomputer chip.

Further, in the digital still camera, a semiconductor memory product such as a video memory and buffer memory is used. As a recording medium, a memory card is used, for example. A semiconductor memory such as a nonvolatile semiconductor memory is used as the main memory in the memory card. The nonvolatile semiconductor memory is a flash memory, for example.

The semiconductor integrated circuit device explained in the second to fifth embodiments can be used in the semiconductor memory.

As described above, this invention is explained with reference to the first to sixth embodiments. However, this invention is not limited to the above embodiments and when this invention is embodied, this invention can be variously modified without departing from the technical scope thereof. For example, as an example of the memory, the SRAM memory cell is shown as an example, but the device according to the embodiments of this invention can be applied to a semiconductor memory other than the SRAM.

Further, the above embodiments can be independently performed, but they can be adequately combined and performed.

In the above embodiments, inventions of various stages can be contained and inventions of various stages can be extracted by adequately combining a plurality of constituents disclosed in the above embodiments.

Further, in the above embodiments, this invention is explained by taking examples in which this invention is applied to the semiconductor integrated circuit device, for example, semiconductor memory, but the semiconductor integrated circuit device containing the semiconductor memory such as a processor, system LSI or the like is contained in the scope of this invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a first memory circuit which stores normal data;
a second memory circuit which stores determination information to determine whether a value of the normal data is changed, capacitance of a data storage node of the second memory circuit being larger than that of a data storage node of the first memory circuit; and
a determination circuit which determines whether a value of the normal data is changed based on the determination information.

2. The device according to claim 1, wherein a first capacitor is connected to the data storage node of the first memory circuit, a second capacitor is connected to the data storage node of the second memory circuit and capacitance of the second capacitor is larger than that of the first capacitor.

3. The device according to claim 1, wherein the first and second memory circuits are latch circuits and size of a transistor in the second memory circuit is larger than that of a transistor in the first memory circuit.

4. The device according to claim 3, wherein one of areas of source and drain regions of the transistor in the second memory circuit is larger than one of areas of source and drain regions of the transistor in the first memory circuit.

5. A semiconductor integrated circuit device comprising:
a first memory circuit which stores operation information;
an even-odd determination circuit which determines one of even and odd numbers of operation information items stored in the first memory circuit;
a second memory circuit which stores determination information used to determine which one of the even and odd numbers of operation information items stored in the first memory circuit is true, capacitance of a data storage node of the second memory circuit being larger than that of a data storage node of the first memory circuit; and
a determination circuit which determines whether a value of the operation information is changed based on the determination information.

6. The semiconductor integrated circuit device according to claim 5, wherein the determination circuit stores the operation information into the first memory circuit again when it is determined that a value of the operation information is changed.

7. The device according to claim 5, wherein a first capacitor is connected to the data storage node of the first memory circuit, a second capacitor is connected to the data storage node of the second memory circuit and capacitance of the second capacitor is larger than that of the first capacitor.

8. The device according to claim 5, wherein the first and second memory circuits are latch circuits and size of a transistor in the second memory circuit is larger than that of a transistor in the first memory circuit.

9. The device according to claim 8, wherein one of areas of source and drain regions of the transistor in the second memory circuit is larger than one of areas of source and drain regions of the transistor in the first memory circuit.

10. A semiconductor integrated circuit device comprising:
a first memory circuit which stores operation information;
a second memory circuit which stores an error correction code to correct an error occurring in the operation information, capacitance of a data storage node of the second memory circuit being larger than that of a data storage node of the first memory circuit; and an error correction processing circuit which corrects an error occurring in the operation information based on the error correction code.

11. The device according to claim 10, wherein a first capacitor is connected to the data storage node of the first memory circuit, a second capacitor is connected to the data storage node of the second memory circuit and capacitance of the second capacitor is larger than that of the first capacitor.

12. The device according to claim 10, wherein the first and second memory circuits are latch circuits and size of a transistor in the second memory circuit is larger than that of a transistor in the first memory circuit.

13. The device according to claim 12, wherein one of areas of source and drain regions of the transistor in the second memory circuit is larger than one of areas of source and drain regions of the transistor in the first memory circuit.

* * * * *